United States Patent
Lee et al.

(10) Patent No.: US 8,388,152 B2
(45) Date of Patent: Mar. 5, 2013

(54) LIGHT-EMITTING DEVICE AND PROJECTOR

(75) Inventors: Hung-Lin Lee, Hsin-Chu (TW); Shiuan-Ting Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 274 days.

(21) Appl. No.: 12/880,224

(22) Filed: Sep. 13, 2010

(65) Prior Publication Data

US 2011/0157565 A1    Jun. 30, 2011

(30) Foreign Application Priority Data

Dec. 30, 2009    (CN) .......................... 2009 1 0263730

(51) Int. Cl.
*G03B 21/00*    (2006.01)

(52) U.S. Cl. ........ 353/122; 353/102; 353/119; 353/100; 362/382

(58) Field of Classification Search ................ 353/31, 353/100, 102, 119, 122; 362/311, 239, 244, 362/250, 281, 419, 422, 449, 455, 458, 257, 362/362, 382; 348/750, 757, 758, 801
See application file for complete search history.

(56) References Cited

U.S. PATENT DOCUMENTS

| | | | | |
|---|---|---|---|---|
| 6,193,401 | B1 * | 2/2001 | Girkin et al. | 362/551 |
| 7,384,153 | B2 * | 6/2008 | Nakamura | 353/56 |
| 7,490,962 | B2 * | 2/2009 | Liu et al. | 362/307 |
| 7,929,214 | B2 * | 4/2011 | Teijido et al. | 359/629 |
| 7,942,537 | B2 * | 5/2011 | Krijn et al. | 362/19 |
| 7,950,818 | B2 * | 5/2011 | Klipstein et al. | 362/157 |
| 2006/0203352 | A1 * | 9/2006 | Pashley | 359/634 |
| 2010/0103660 | A1 * | 4/2010 | van de Ven et al. | 362/231 |

FOREIGN PATENT DOCUMENTS

| | | |
|---|---|---|
| TW | M261399 | 4/2005 |
| TW | M298144 | 9/2006 |
| TW | M358248 | 6/2009 |
| TW | M362415 | 8/2009 |

* cited by examiner

*Primary Examiner* — William C Dowling
*Assistant Examiner* — Sultan Chowdhury
(74) *Attorney, Agent, or Firm* — WPAT PC; Justin King

(57) ABSTRACT

A light-emitting device includes a circuit board, a light-emitting element, a light-condensing element, and a glue. The circuit board has through holes, a first surface, and a second surface. The through hole has a first pathway and a second pathway. The first pathway extends from the first surface into the circuit board. The second pathway extends from the second surface into the circuit board and communicates with the first pathway. An accommodating space of the second pathway is greater than that of the first pathway. The light-emitting element is disposed on and electrically connected to the first surface. The light-condensing element has positioning posts. A portion of the light-condensing element is disposed on the light-emitting element. The positioning post passes through the first pathway and is located inside the second pathway. The glue is disposed in the second pathway for fixing the positioning posts in the through hole.

14 Claims, 6 Drawing Sheets

LIGHT-EMITTING DEVICE AND PROJECTOR

BACKGROUND

1. Field of the Invention

The invention relates to a light-emitting device, and in particular, to a projector with the light-emitting device.

2. Description of the Prior Art

Traditional light-emitting devices are disclosed in many patents such as Taiwan patent no. M358248, Taiwan patent no. M362415, and Taiwan patent no. M261399. However, a light-emitting device applied to a projector is particularly designed for emitting light beams with higher brightness and for occupying smaller space.

A traditional projector includes an illuminating system, a light valve, and an imaging system. The illuminating system is capable of emitting an illumination beam. The light valve is disposed in a transmission path of the illumination beam and capable of transforming the illumination beam into an image beam. The imaging system is disposed in a transmission path of the image beam and a projection lens of the imaging system is capable of projecting the image beam to a screen.

The illuminating system includes a plurality of light-emitting devices. Each of the light-emitting devices includes a light source module and an aspherical lens. Each of the light source modules includes a light-emitting diode chip (LED chip). Each of the aspherical lenses is disposed on the corresponding LED chip for appropriately condensing light emitted from the corresponding LED chip.

However, in the traditional techniques, the light source modules are respectively disposed at an opening of a casing of the projector. The aspherical lenses are disposed on a frame of the casing and corresponding to the LED chips of the light source modules, respectively. Therefore, relative relationship of positions between each of the aspherical lenses and the LED chip of the corresponding light source modules may be easily influenced by assembly tolerance such that the optical performance of each of the light-emitting devices will get worse after assembly.

BRIEF SUMMARY

The invention is directed to provide a light-emitting device with better optical performance.

The invention is also directed to provide a projector of which the optical performance of a light-emitting device is better.

Other advantages and objects of the invention may be further comprehended through the technical features disclosed in the invention.

In order to achieve at least one of the objectives or other objectives, in an embodiment of the invention, a light-emitting device is provided. The light-emitting device includes a circuit board, a light-emitting element, a light-condensing element, and a glue. The circuit board has a plurality of through holes, a first surface, and a second surface opposite to the first surface. Each of the through holes has a first pathway and a second pathway. Each of the first pathways extends from the first surface into the circuit board. Each of the second pathways extends from the second surface into the circuit board and communicates with one of the first pathways. An accommodating space of each of the second pathways is greater than an accommodating space of the corresponding first pathway.

The light-emitting element is disposed on the first surface and electrically connected to the first surface. The light-condensing element has a plurality of positioning posts. A portion of the light-condensing element is disposed on the light-emitting element. Each of the positioning posts passes through one of the first pathways and is located inside the corresponding second pathway. The glue is disposed in the second pathways for fixing each of the positioning posts in the corresponding through hole.

In an embodiment of the invention, the light-condensing element has a plurality of contact surfaces. The positioning posts are disposed on the contact surfaces, respectively. The contact surfaces cover the first pathways respectively and contact the first surface.

In an embodiment of the invention, a diameter of each of the second pathways is greater than a diameter of the corresponding first pathway.

In an embodiment of the invention, the light-condensing element includes an aspherical lens disposed on the light-emitting element.

In an embodiment of the invention, the light-emitting element is an LED chip.

In an embodiment of the invention, the glue is formed by means of dispensing glue method.

In order to achieve at least one of the objectives or other objectives, in an embodiment of the invention, a projector is provided. The projector includes an illuminating system, a light valve, and an imaging system. The illuminating system is capable of emitting an illumination beam and includes the light-emitting device. The light valve is disposed in a transmission path of the illumination beam and capable of transforming the illumination beam into an image beam. The imaging system is disposed in a transmission path of the image beam and capable of projecting the image beam onto a screen.

The embodiments of the invention have at least one of the following or other advantages. Because the light-condensing element of the light-emitting device is disposed on the circuit board and a portion of the light-condensing element is disposed on the light-emitting element, as compared to the traditional techniques, the relative position between the light-condensing element and the light-emitting element of the light-emitting device may more likely meet the required accuracy when the light-emitting device is assembled. Accordingly, the optical performance of the light-emitting device assembled is better.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the embodiments of the invention, and are incorporated in and constitute part of this specification. The drawings illustrate embodiments of the invention and, together with the description, serve to explain the principles of the invention.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
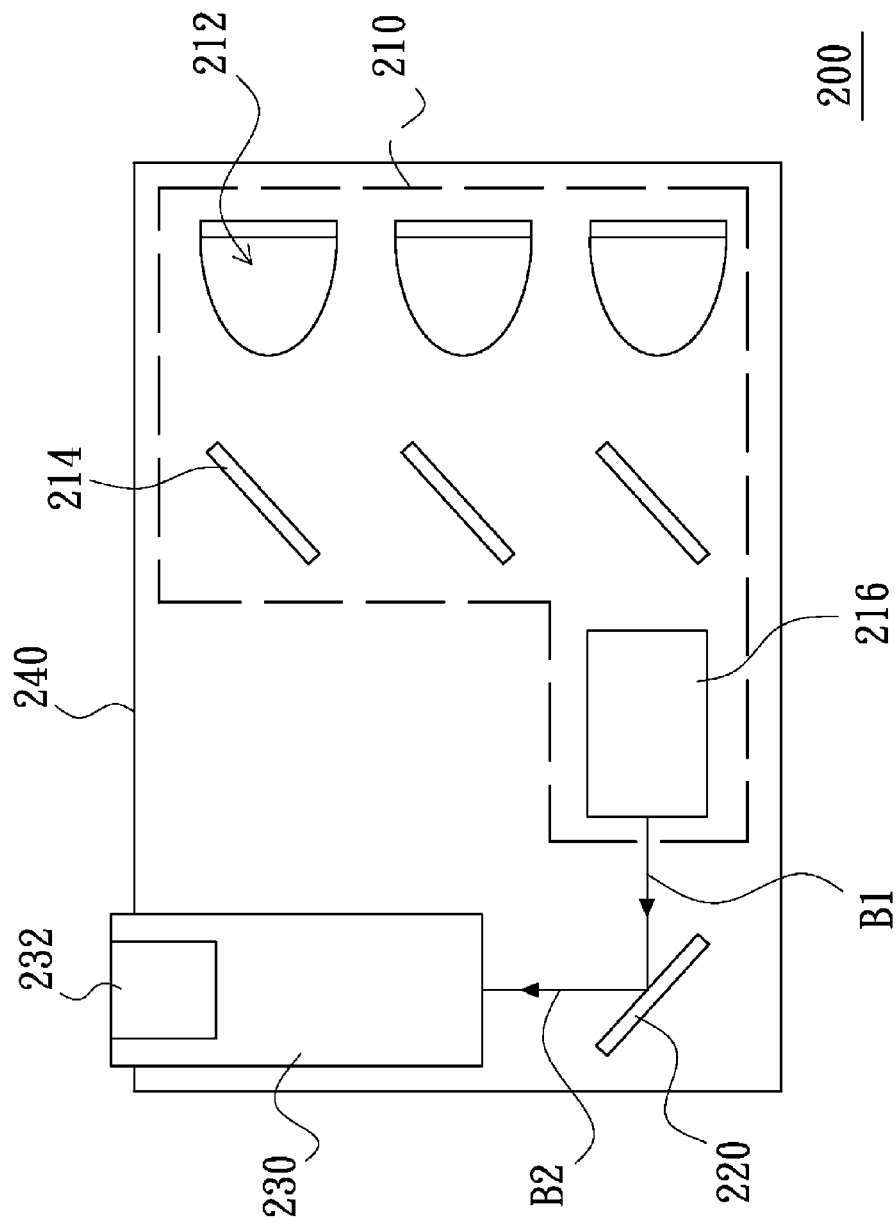
FIG. 1 is a schematic top view of a projector according to an embodiment of the invention.
Figure 2A:
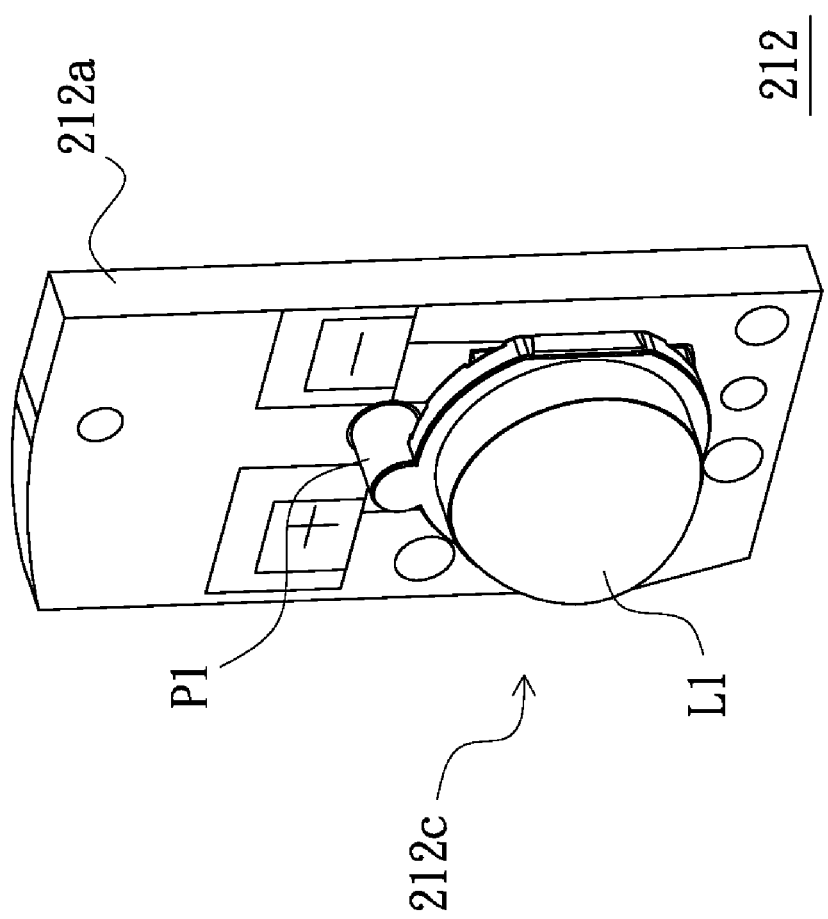
FIG. 2A is a schematic three-dimensional view of a light-emitting device of FIG. 1.
Figure 2B:
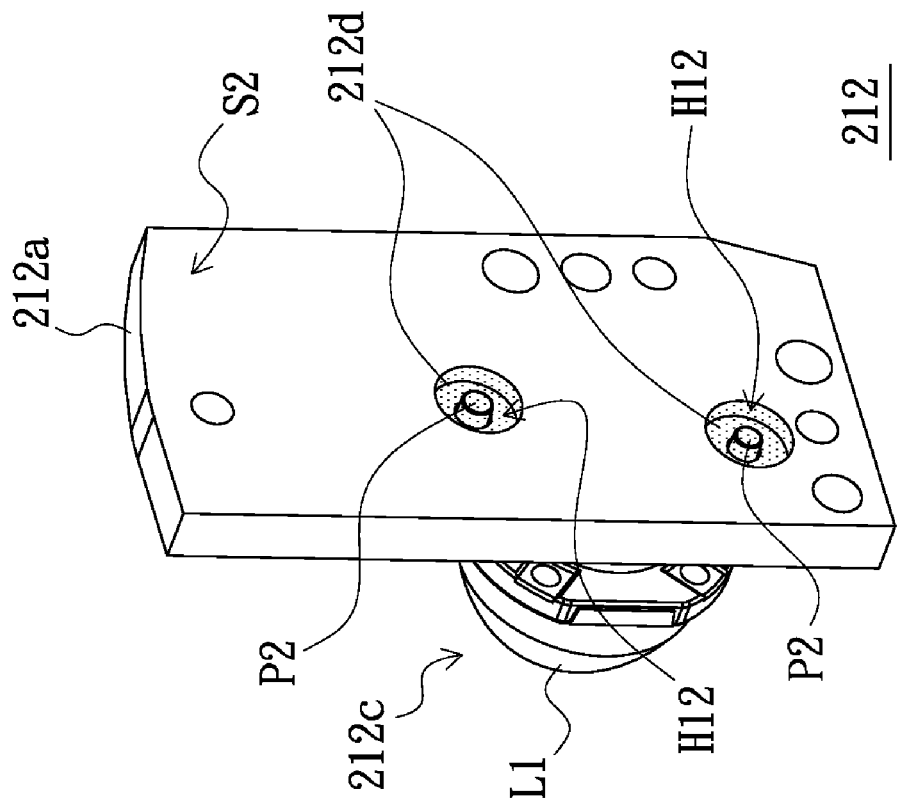
FIG. 2B is another schematic three-dimensional view of the light-emitting device of FIG. 2A.
Figure 2C:
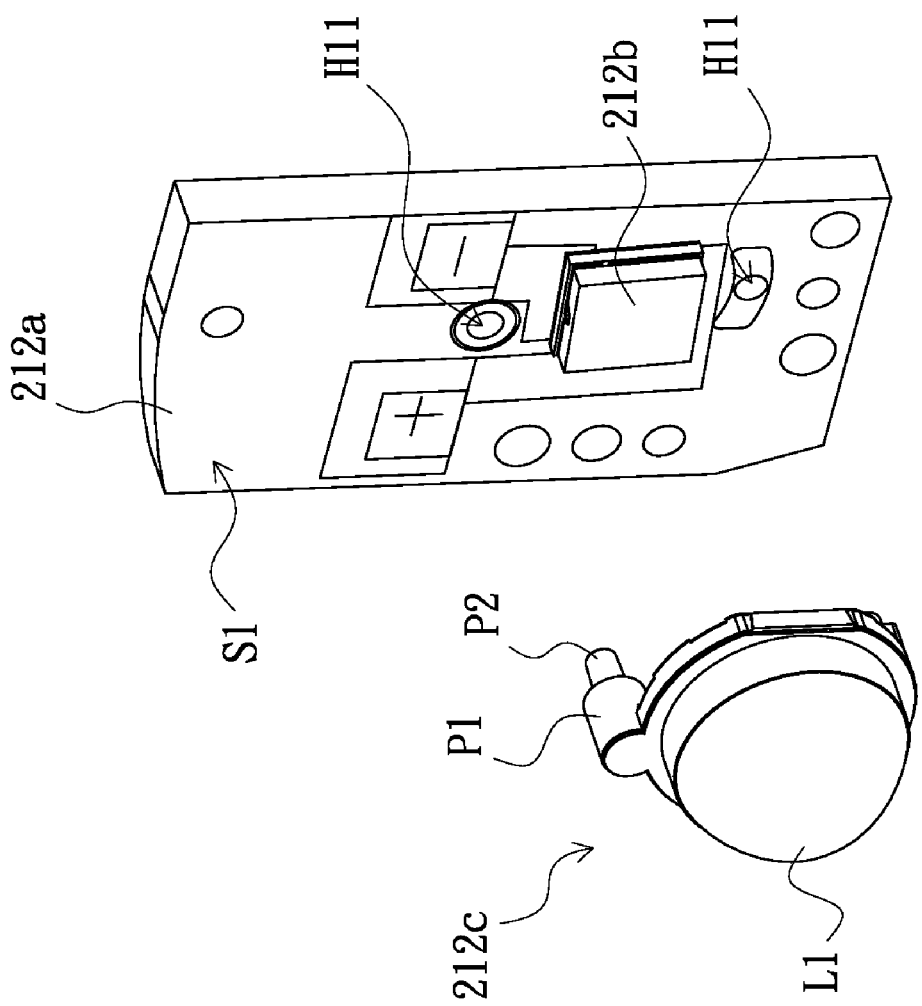
FIG. 2C is a schematic partially-exploded view of the light-emitting device of FIG. 2A.
Figure 2D:
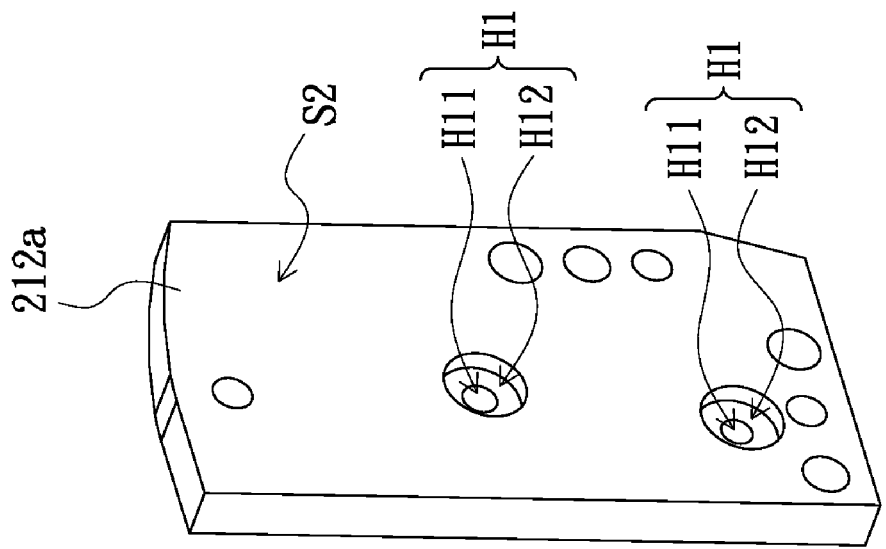
FIG. 2D is another schematic partially-exploded view of the light-emitting device of FIG. 2A.
Figure 2D:
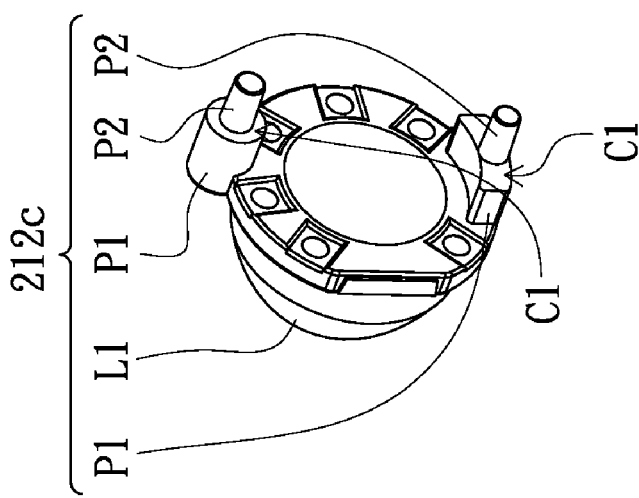
Figure 2E:
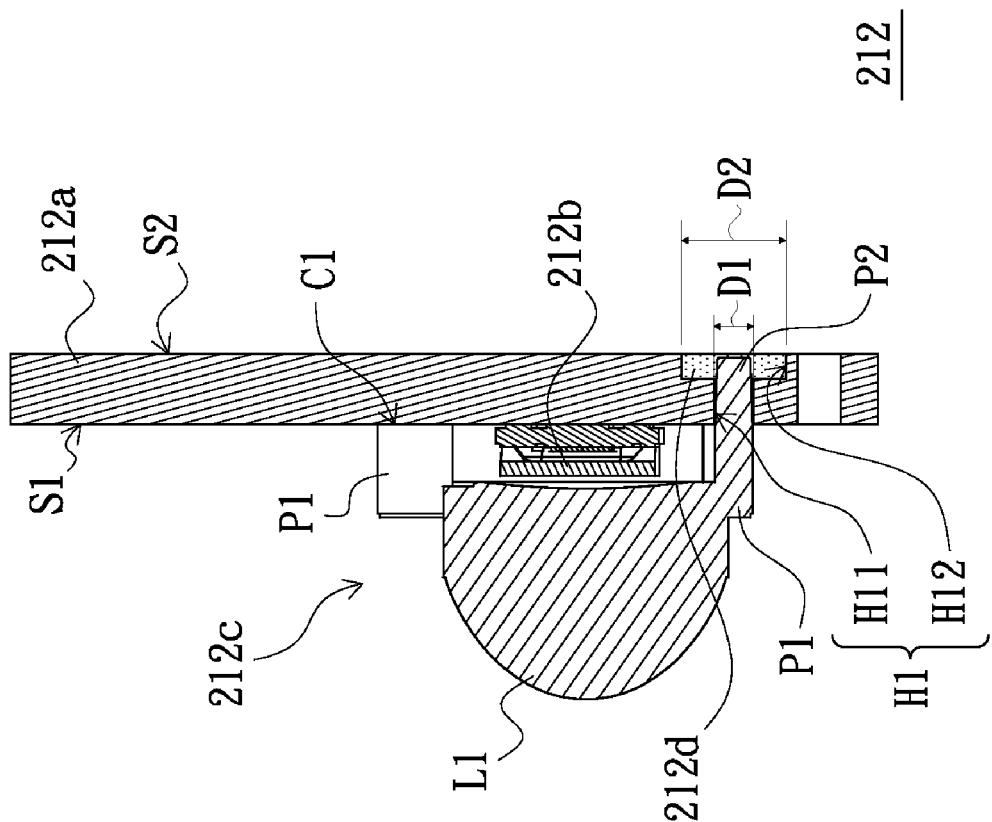
FIG. 2E is a schematic cross-sectional view of the light-emitting device of FIG. 2A.

FIG. 1 is a schematic top view of a projector according to an embodiment of the invention. FIG. 2A is a schematic three-dimensional view of a light-emitting device of FIG. 1. FIG. 2B is another schematic three-dimensional view of the light-emitting device of FIG. 2A. FIG. 2C is a schematic partially-exploded view of the light-emitting device of FIG. 2A. FIG. 2D is another schematic partially-exploded view of the light-emitting device of FIG. 2A. FIG. 2E is a schematic cross-sectional view of the light-emitting device of FIG. 2A.

Firstly, referring to FIG. 1, the projector 200 of the embodiment includes an illuminating system 210, a light valve 220, an imaging system 230, and a casing 240. The illuminating system 210, the light valve 220, and at least a portion of the imaging system 230 are disposed in the casing 240. The illuminating system 210 is capable of emitting an illumination beam B1 and includes a plurality of light-emitting devices 212, a plurality of dichroic mirrors 214, and a light-uniforming element 216. The light-emitting devices 212 are capable of emitting red light beam, green light beam, and blue light beam, respectively. The dichroic mirrors 214 are corresponding to the light-emitting devices 212, respectively. The light-uniforming element 216, such as an integration rod, is corresponding to at least one of the dichroic mirrors 214.

During operation of the projector 200 of the embodiment, at any moment, one of the light-emitting devices 212 emits a light beam and the light beam is affected by at least one of the dichroic mirrors 214 and the light-uniforming element 216 to form the illumination beam B1. Therefore, the illumination beam B1 at different moments appears red color, green color, or blue color respectively.

The light valve 220 is disposed in a transmission path of the illumination beam B1 and capable of transforming the illumination beam B1 into an image beam B2. The light valve 220 is, for example, a digital micromirror device (DMD). The imaging system 230 has a projection lens 232 and is disposed in a transmission path of the image beam B2. The imaging system 230 is capable of projecting the image beam B2 onto a screen (not shown).

Hereinafter, one of the light-emitting devices 212 is explained in details. Referring to FIGS. 2A to 2E, the light-emitting device 212 includes a circuit board 212a, a light-emitting element 212b, a light-condensing element 212c, and a glue 212d. The circuit board 212a has a plurality of through holes H1, a first surface S1, and a second surface S2 opposite to the first surface S1. Each of the through holes H1 has a first pathway H11 and a second pathway H12. Each of the first pathways H11 extends from the first surface S1 of the circuit board 212a into the circuit board 212a. Each of the second pathways H12 extends from the second surface S2 of the circuit board 212a into the circuit board 212a and communicates with one of the first pathways H11. An accommodating space of each of the second pathways H12 is greater than an accommodating space of the corresponding first pathway H11. In this embodiment, a diameter D2 of the second pathway H12 of each of the through holes H1 is greater than a diameter D1 of the corresponding first pathway H11.

The light-emitting element 212b is disposed on the first surface S1 of the circuit board 212a and electrically connected to the first surface S1 of the circuit board 212a. The light-emitting element 212b is, for example, an LED chip. The light-condensing element 212c includes an aspherical lens L1, a plurality of support posts P1, and a plurality of positioning posts P2. A portion of the light-condensing element 212c, such as the aspherical lens L1, is disposed on the light-emitting element 212b for appropriately condensing light emitted from the corresponding light-emitting element 212b.

The support posts P1 are disposed besides the aspherical lens L1 and each of the support posts P1 has a contact surface C1. The contact surfaces C1 cover the first pathways H11 of the through holes H1, respectively and contact the first surface S1 of the circuit board 212a. The positioning posts P2 are disposed on the contact surfaces C1, respectively. Each of the positioning posts P2 passes through the first pathway H11 of one of the through holes H1 and is located inside the corresponding second pathway H12. The glue 212d is disposed in the second pathways H12 for fixing each of the positioning posts P2 in the corresponding through hole H1. In another embodiment of the invention, the glue 212d fills about ½ to ⅔ of the depth of the second pathways H12 for fixing the positioning posts P2. The second surface S2 is a planar surface such that a heat sink (not shown) may be closely disposed on the second surface S2. In this embodiment, the glue 212d is formed by means of dispensing glue method.

Because the light-condensing element 212c of each of the light-emitting devices 212 may be directly disposed on the corresponding circuit board 212a and a portion of the light-condensing element 212c may be directly disposed on the corresponding light-emitting element 212b, as compared to the traditional techniques, the relative position between the light-condensing element 212c and the corresponding light-emitting element 212b of each of the light-emitting devices 212 of the projector 200 of the embodiment may more likely meet the required accuracy when each of the light-emitting devices is assembled. More specifically, the diameter of the first pathway H11 is greater than a diameter of the corresponding positioning post P2, that is, the first pathway H11 provides a space for movement of the corresponding positioning post P2 such that the position of the light-condensing element 212c relative to the corresponding light-emitting element 212b may be further regulated after the positioning posts P2 passes through the first pathways H11, respectively. Then, the positioning posts P2 are fixed by the glue 212d such that the relative position between the light-condensing element 212c and the corresponding light-emitting element 212b may more likely meet the required accuracy when the light-emitting device is assembled. Additionally, the light-condensing element 212c of the light-emitting device 212 may be directly disposed on the corresponding circuit board 212a, and therefore, as compared to the traditional techniques, an element is omitted in the invention such that the assembly tolerance is further decreased. Accordingly, the optical performance of each of the light-emitting devices 212 assembled is better.

Furthermore, because the accommodating space of the second pathway H12 of each of the through holes H1 of the circuit board 212a of each of the light-emitting devices 212 is greater than the accommodating space of the corresponding first pathway H11, the joint strength between the glue 212d disposed in the second pathways H12 of the through holes H1 and the positioning posts P2 of the corresponding light-condensing element 212c is increased.

Moreover, because the contact surfaces C1 of the light-condensing element 212c of each of the light-emitting devices 212 cover the first pathways H11 of the corresponding through holes H1, respectively and contact the first surface S1 of the corresponding circuit board 212a, the glue 212d unlikely leaks from the corresponding first surface S1 through the corresponding first pathways H11.

According to the mentioned above, the embodiments of the invention have at least one of the following or other advantages:

1. Because the light-condensing element of the light-emitting device is disposed on the circuit board and a portion of the light-condensing element is disposed on the light-emitting element, as compared to the traditional techniques, the relative position between the light-condensing element and the light-emitting element of the light-emitting device may more likely meet the required accuracy when the light-emitting devices is assembled. Therefore, the optical performance of the light-emitting device assembled is better.

2. Because the accommodating space of the second pathway of each of the through holes of the circuit board of the light-emitting device is greater than the accommodating space of the corresponding first pathway, the joint strength between the glue disposed in the second pathways of the through holes and the positioning posts of the light-condensing element is increased.

3. Because the contact surfaces of the light-condensing element of the light-emitting device cover the first pathways of the through holes, respectively and contact the first surface of the circuit board, the glue unlikely leaks from the first surface through the first pathways.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light-emitting device comprising:
   a circuit board having a plurality of through holes, a first surface, and a second surface opposite to the first surface, wherein each of the through holes has a first pathway and a second pathway, each of the first pathways extends from the first surface into the circuit board, each of the second pathways extends from the second surface into the circuit board and communicates with one of the first pathways, and an accommodating space of each of the second pathways is greater than an accommodating space of the corresponding first pathway;
   a light-emitting element disposed on the first surface and electrically connected to the first surface;
   a light-condensing element having a plurality of positioning posts, wherein a portion of the light-condensing element is disposed on the light-emitting element, and each of the positioning posts passes through one of the first pathways and is located inside the corresponding second pathway; and
   a glue disposed in the second pathways for fixing each of the positioning posts in the corresponding through hole.

2. The light-emitting device as claimed in claim 1, wherein the light-condensing element has a plurality of contact surfaces, the positioning posts are disposed on the contact surfaces respectively, and the contact surfaces cover the first pathways respectively and contact the first surface.

3. The light-emitting device as claimed in claim 1, wherein a diameter of each of the second pathways is greater than a diameter of the corresponding first pathway.

4. The light-emitting device as claimed in claim 1, wherein the light-condensing element comprises an aspherical lens disposed on the light-emitting element.

5. The light-emitting device as claimed in claim 1, wherein the light-emitting element is a light-emitting diode chip.

6. The light-emitting device as claimed in claim 1, wherein the glue is formed by means of dispensing glue method.

7. The light-emitting device as claimed in claim 2, wherein the light-condensing element further comprises a plurality of support posts, and each of the support posts has the contact surface.

8. A projector comprising:
an illuminating system capable of emitting an illumination beam, comprising:
at least a light-emitting device comprising:
a circuit board having a plurality of through holes, a first surface, and a second surface opposite to the first surface, wherein each of the through holes has a first pathway and a second pathway, each of the first pathways extends from the first surface into the circuit board, each of the second pathways extends from the second surface into the circuit board and communicates with one of the first pathways, and an accommodating space of each of the second pathways is greater than an accommodating space of the corresponding first pathway;
a light-emitting element disposed on the first surface and electrically connected to the first surface;
a light-condensing element having a plurality of positioning posts, wherein a portion of the light-condensing element is disposed on the light-emitting element, and each of the positioning posts passes through one of the first pathways and is located inside the corresponding second pathway; and
a glue disposed in the second pathways for fixing each of the positioning posts in the corresponding through hole;
a light valve disposed in a transmission path of the illumination beam and capable of transforming the illumination beam into an image beam; and
an imaging system disposed in a transmission path of the image beam and capable of projecting the image beam onto a screen.

9. The projector as claimed in claim 8, wherein the light-condensing element has a plurality of contact surfaces, the positioning posts are disposed on the contact surfaces respectively, and the contact surfaces cover the first pathways respectively and contact the first surface.

10. The projector as claimed in claim 8, wherein a diameter of each of the second pathways is greater than a diameter of the corresponding first pathway.

11. The projector as claimed in claim 8, wherein the light-condensing element comprises an aspherical lens disposed on the light-emitting element.

12. The projector as claimed in claim 8, wherein the light-emitting element is a light-emitting diode chip.

13. The projector as claimed in claim 8, wherein the glue is formed by means of dispensing glue method.

14. The light-emitting device as claimed in claim 9, wherein the light-condensing element further comprises a plurality of support posts, and each of the support posts has the contact surface.

* * * * *